United States Patent
Liao et al.

(10) Patent No.: US 12,464,684 B2
(45) Date of Patent: Nov. 4, 2025

(54) DIRECTING COOLANT TO FLOW TOWARD HEAT SINKS OF ELECTRIC COMPONENTS IN IMMERSION COOLING SYSTEMS

(71) Applicant: Super Micro Computer, Inc., San Jose, CA (US)

(72) Inventors: Yi-Kuan Liao, Taoyuan (TW); Kuan-Lin Peng, Taoyuan (TW)

(73) Assignee: Super Micro Computer, Inc., San Jose, CA (US)

( * ) Notice: Subject to any disclaimer, the term of this patent is extended or adjusted under 35 U.S.C. 154(b) by 289 days.

(21) Appl. No.: 18/314,574

(22) Filed: May 9, 2023

(65) Prior Publication Data
US 2024/0381585 A1    Nov. 14, 2024

(51) Int. Cl.
  *H05K 7/20*    (2006.01)
  *H05K 1/02*    (2006.01)

(52) U.S. Cl.
  CPC ....... *H05K 7/20772* (2013.01); *H05K 1/0203* (2013.01); *H05K 7/20409* (2013.01)

(58) Field of Classification Search
  CPC ........... H05K 7/20772; H05K 7/20409; H05K 1/0203
  USPC ...................................................... 361/699
  See application file for complete search history.

(56) References Cited

U.S. PATENT DOCUMENTS

| | | | |
|---|---|---|---|
| 2010/0103618 A1* | 4/2010 | Campbell | H05K 7/20772 361/699 |
| 2014/0085823 A1* | 3/2014 | Campbell | H05K 7/20 361/689 |
| 2014/0123492 A1* | 5/2014 | Campbell | H05K 7/203 29/890.03 |
| 2015/0109735 A1* | 4/2015 | Campbell | H05K 7/2079 361/700 |
| 2019/0297747 A1* | 9/2019 | Wakino | H01L 23/427 |
| 2022/0408612 A1* | 12/2022 | Peterson | H05K 7/20318 |

OTHER PUBLICATIONS

"Forced Convection", Energy Education, University of Calgary, https://energyeducation.ca/encyclopedia/Forced_convection#:~:text=, downloaded May 2, 2023.
"Forced Convection", Wikipedia, https://en.wikipedia.org/wiki/Forced_convection, Jun. 24, 2022.
"Forced Convection", Wikipedia, https://en.wikipedia.org/wiki/Immersion_cooling, Jun. 14, 2023.
"Ku:1 chassis-level precision immersion", Iceotope, https://en.wikipedia.org/wiki/Immersion_cooling, Jun. 24, 2022.

* cited by examiner

*Primary Examiner* — Zhengfu J Feng
(74) *Attorney, Agent, or Firm* — Beyer Law Group LLP

(57) ABSTRACT

An immersion cooling system includes a tank that contains a dielectric coolant. A main pump circulates the dielectric coolant through the tank and a heat exchanger. Electronic devices are submerged in the dielectric coolant in the tank. An electronic device includes a substrate, an electronic component that is mounted on the substrate, a heat sink that is attached to the electronic component, and a forced convection device that directs the dielectric coolant from within a housing of the electronic device toward the heat sink.

24 Claims, 7 Drawing Sheets

DIRECTING COOLANT TO FLOW TOWARD HEAT SINKS OF ELECTRIC COMPONENTS IN IMMERSION COOLING SYSTEMS

TECHNICAL FIELD

The present disclosure is directed to immersion cooling of electronic devices.

BACKGROUND

Electronic devices, such as computers, generate a lot of heat during operation. Cooling systems have been developed to prevent electronic devices from overheating. A simple cooling system involves the use of cooling fans to blow air toward heat-generating components of an electronic device. A more sophisticated approach is immersion cooling, where the electronic device is submerged in a liquid dielectric coolant that is thermally conductive but electrically insulating. Heat generated by components of the electronic device is transferred to the dielectric coolant, which is circulated by a pump through a heat exchanger.

BRIEF SUMMARY

In one embodiment, an immersion cooling system comprises a tank that contains a dielectric coolant, a main pump that is external to the tank, and an electronic device. The main pump has a discharge end that is coupled to an inlet of the tank and a suction end that is coupled to an outlet of the tank. The electronic device is submerged in the dielectric coolant in the tank. The electronic device comprises: a motherboard; an electronic component; a heat sink that is attached to the electronic component; and a forced convection device that directs the dielectric coolant toward the heat sink. The forced convection device may be an internal pump, an axial fan that pushes the dielectric coolant through a fan shroud toward the heat sink, or a centrifugal fan that is attached to the heat sink. The heat sink may have a plurality of cooling fins. The heat sink may also be a cold plate. The electronic component may be a central processing unit (CPU), graphics processing unit (GPU), or other high power density integrated circuit (IC).

In another embodiment, an immersion cooling system comprises a tank that contains a dielectric coolant, a first pump that is external to the tank, and a plurality of electronic devices. The first pump has a discharge end that is coupled to an inlet of the tank and a suction end that is coupled to an outlet of the tank to circulate the dielectric coolant through the tank. The plurality of electronic devices are submerged in the dielectric coolant in the tank. Each of the plurality of electronic devices comprises: a motherboard; a first electronic component that is mounted on the motherboard; a first heat sink that is attached to the first electronic component; a first connecting tube having a first end that is coupled to the first heat sink; and a second pump that is submerged in the dielectric coolant. The second pump has a suction end that is open to receive the dielectric coolant and a discharge end that is coupled to a second end of the first connecting tube. The second pump pushes the dielectric coolant from within a housing of the electronic device toward the first heat sink through the first connecting tube.

In yet another embodiment, an immersion cooling system comprises a tank, a main pump that is external to the tank, and an electronic device. The main pump has a discharge end that is coupled to an inlet of the tank and a suction end that is coupled to an outlet of the tank. The electronic device is submerged in the dielectric coolant in the tank. The electronic device comprises: a substrate; an electronic component that is mounted on the substrate; a heatsink that is attached to the electronic component; and an internal pump that is submerged in the dielectric coolant in the tank. The internal pump has a suction end that is open to receive the dielectric coolant and a discharge end that flows the dielectric coolant toward the heat sink through a connecting tube. The substrate may be a motherboard, and the electronic component may be a CPU, a GPU, or other high power density IC.

In yet another embodiment, a method of immersion cooling a plurality of electronic devices comprises: submerging the plurality of electronic devices in a dielectric coolant in a tank; using a main pump that is external to the tank to circulate the dielectric coolant through the tank and a heat exchanger; and for each of the plurality of electronic devices, using a forced convection device to direct the dielectric coolant from within a housing of the electronic device toward a heat sink that is attached to an electronic component of the electronic device. The forced convection device may be an internal pump that directs the dielectric coolant toward the heatsink through a connecting tube. The forced convection device may also be an axial fan that directs the dielectric coolant toward the heatsink through a fan shroud. The forced convection device may also be a centrifugal fan that is attached to the heat sink. The electronic component may be a CPU, a GPU, or other high power density IC.

These and other features of the present disclosure will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. The drawings are not to scale.

DETAILED DESCRIPTION

In the present disclosure, numerous specific details are provided, such as examples of systems, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
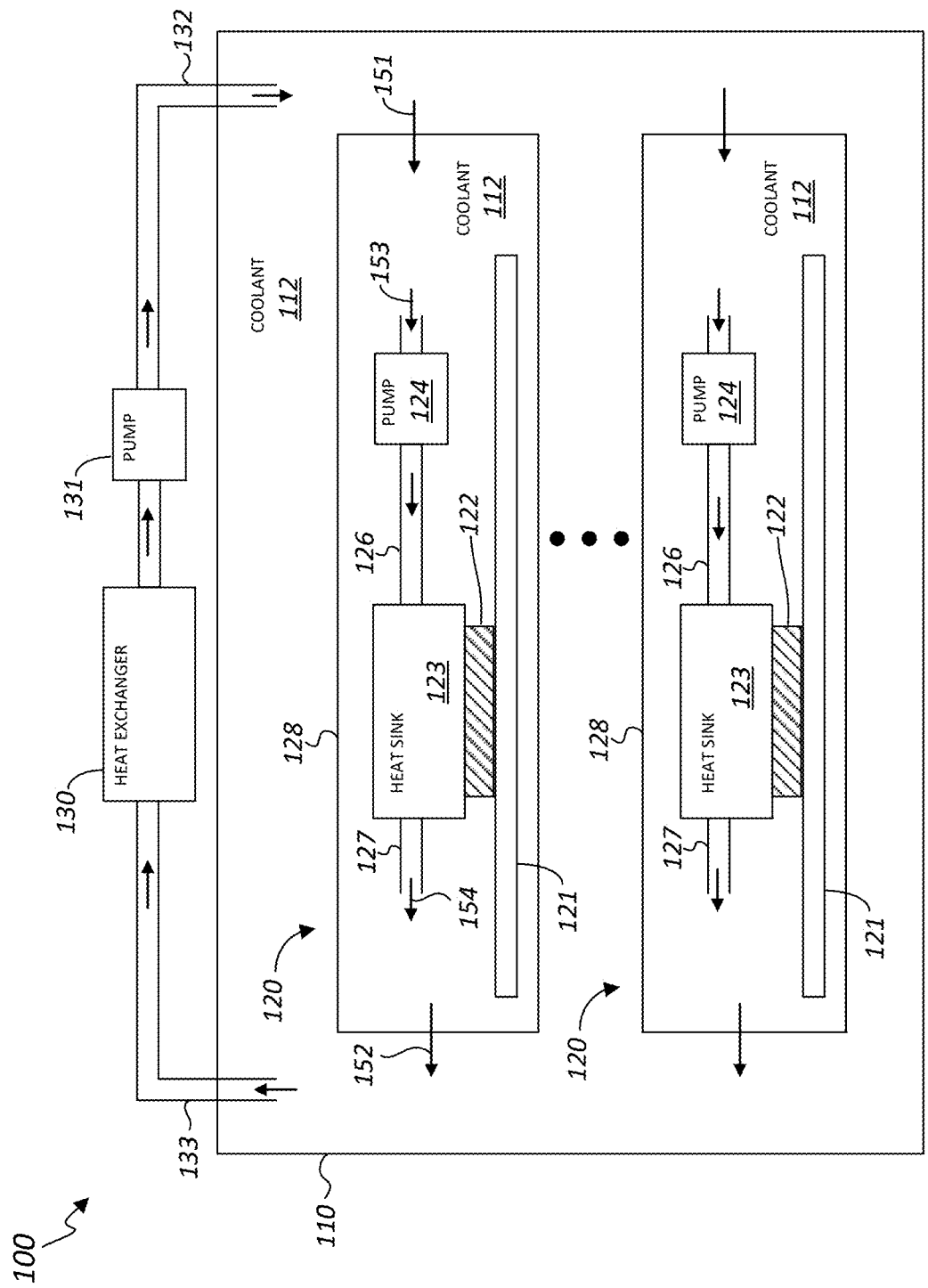
FIG. 1 is a schematic diagram of an immersion cooling system in accordance with an embodiment of the present invention.

FIG. 1 is a schematic diagram of an immersion cooling system 100 in accordance with an embodiment of the present invention. In the example of FIG. 1, the immersion cooling system 100 comprises a tank 110, a heat exchanger 130, and a main pump 131. The heat exchanger 130 and the main pump 131 are external to the tank 110. The tank 110 is configured to accept a plurality of electronic devices 120, which in one embodiment are server computers. The tank 110 contains a dielectric coolant 112, in which the electronic devices 120 are submerged for immersion cooling.

The main pump 131 has a suction end that is coupled to an outlet 133 of the tank 110, and a discharge end that is coupled to an inlet 132 of the tank 110. The heat exchanger 130 is coupled between the outlet 133 of tank 110 and the suction end of the main pump 131. The main pump 131 circulates the dielectric coolant 112 through the tank 110 and the heat exchanger 130. The heat exchanger 130 and the main pump 131 may be those typically used for immersion cooling applications.

The plurality of electronic devices 120 may have electrical connections to each other and through the tank 110 to electronic devices that are outside the tank 110. These electrical connections are well-known in immersion cooling and are not shown for clarity of illustration.

The dielectric coolant 112 may comprise a single-phase synthetic oil, vegetable oil, mineral oil, fluorochemicals, or suitable dielectric coolant. In one embodiment, considering thermal performance, cost, and ESG (i.e., environmental, social and governance), the dielectric coolant 112 comprises a synthetic oil, such as from the Polyalphaolefin (PAO) family. As can be appreciated, the choice of a dielectric coolant depends on the particular requirements of the immersion cooling application. Embodiments of the present invention are generally applicable to dielectric coolants that are commonly employed for immersion cooling.

An electronic device 120 comprises a substrate in the form of a motherboard 121 (e.g., printed circuit board). One or more electronic components 122 are mounted on the motherboard 121. An electronic component 122 may be a central processing unit (CPU), a graphics processing unit (GPU), or other high power density integrated circuit (IC). It is to be noted that embodiments of the present invention are explained in the context of high power density ICs, because such electronic components are critical components that generate a lot of heat. However, embodiments of the present invention advantageously lower operating temperature and support higher thermal design power (TDP) of electronic components in general.

In the example of FIG. 1, a heat sink 123 is attached to a top surface of an electronic component 122. The heat sink 123 provides a large surface area for dissipating heat from the electronic component 122. The heat sink 123 may be a cold plate or may have a plurality of cooling fins. The electronic device 120 includes a housing 128 that provides mechanical support to the motherboard 121 and other components of the electronic device 120. The housing 128 may have one or more handles (not shown) that facilitate insertion of the electronic device 120 into the tank 120. The housing 128 have open sections that allow the dielectric coolant 112 to enter (see arrow 151) and exit (see arrow 152) the electronic device 120. The electronic device 120 is thus cooled by the dielectric coolant 112 from inside and outside the electronic device 120.

In the example of FIG. 1 and the following figures, arrows represent flow of the dielectric coolant 112 in the immersion cooling system. In operation, the main pump 131 pushes the dielectric coolant 112 to the tank inlet 132, through the tank 110, through the tank outlet 133, and through the heat exchanger 130. Cold dielectric coolant 112 enters the tank 110 through the tank inlet 132 to cool the electric devices 120. Hot dielectric coolant 112 exits the tank 110 through the tank outlet 133 and flows to the heat exchanger 130, which cools the hot dielectric coolant 112. The operating temperature of the dielectric coolant 112 at the tank inlet 132 may be maintained at 40° C. or other suitable temperature.

Although they have desirable characteristics for immersion cooling, some dielectric coolants, such as high-viscosity synthetic oils, are difficult to flow to targeted regions. More particularly, it is difficult to achieve adequate dielectric coolant flow rate to the electronic device 120 or to the heat sink 123 because the electronic device 120 or the heat sink 123 presents a high flow impedance relative to other components in the tank 110. To address this problem, an electronic device 120 includes an internal oil pump 124, which in one embodiment is immersed in the dielectric coolant 112 within the housing 128. The pump 124 has a suction end that is open to receive the dielectric coolant 112 from within the housing 128, and a discharge end that flows the dielectric coolant 112 toward the heat sink 123. In the example of FIG. 1, a connecting tube 126 has a first end that is coupled to the discharge end of the pump 124 and a second end that is coupled to the heat sink 123. The pump 124 receives the dielectric coolant 112 from within the housing 128 (see arrow 153), and pushes the dielectric coolant 112 toward the heat sink 123 through the connecting tube 126, thereby providing forced convection to the heat sink 123. Dielectric coolant 112 directed toward the heat sink 123 exits through a connecting tube 127 (see arrow 154). The connecting tube 127 has a first end that is coupled to the exit side of the heat sink 123, and a second end that is open to the tank 110 or is coupled to another heat sink.

Generally, a connecting tube may be coupled to a heat sink by attaching the connecting tube to the heat sink, placing the connecting tube directly adjacent to the heat sink, or other coupling that provides directed flow of the dielectric coolant toward the heat sink. When the heat sink is a cold plate with internal tubes, a connecting tube may be connected to an inlet of the cold plate and another connecting tube may be connected to an outlet of the cold plate.

When the heat sink has cooling fins but has no internal tubes, a connecting tube may be attached or placed directly adjacent to one side of the heat sink such that the dielectric coolant is directed to flow between cooling fins or channels of the heat sink. Another connecting tube may be attached or placed directly adjacent to an opposite side of the heat sink to direct the dielectric coolant that is exiting the heat sink. In that example, the size and orientation of the connecting tube and the fin pitch or other structural features of the heat sink may be optimized for the particular dielectric coolant and target operating temperature.

Figure 2:
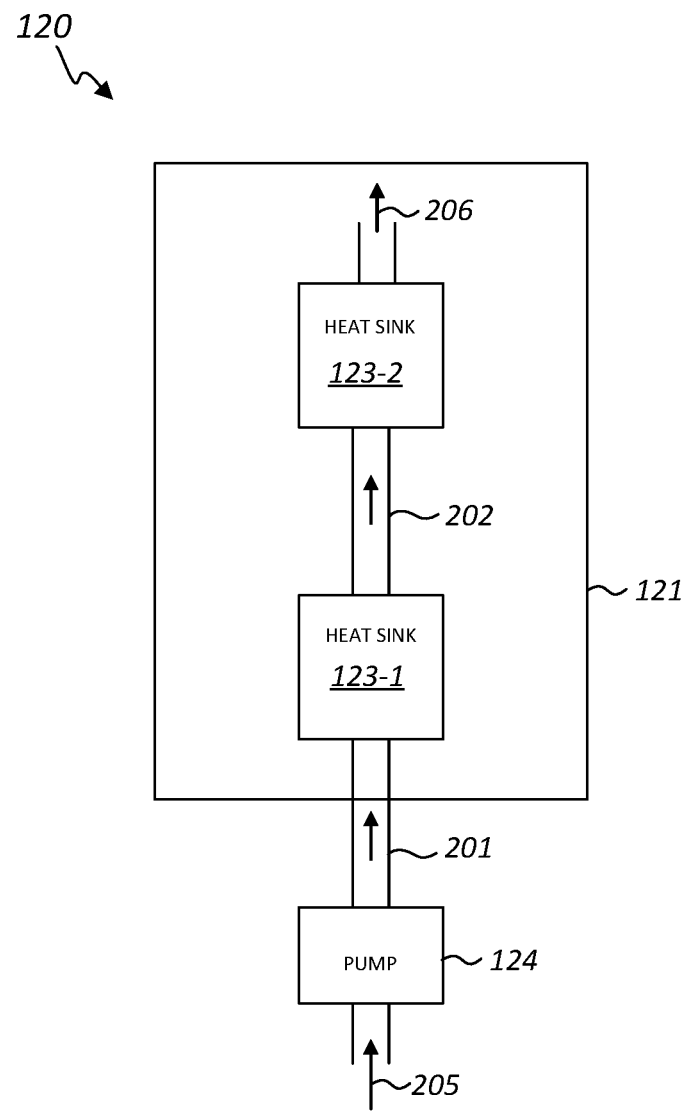
FIG. 2 is a schematic plan view of an electronic device in the immersion cooling system of FIG. 1 in accordance with an embodiment of the present invention.

FIG. 2 is a schematic plan view of an electronic device 120 in the immersion cooling system 100 in accordance with an embodiment of the present invention. In the example of FIG. 2, a plurality of heat sinks 123 (i.e., 123-1, 123-2) are attached on corresponding electronic components that are mounted on the motherboard 121. The pump 124 pushes the dielectric coolant toward the heat sinks 123 by way of connecting tubes that are arranged in series. More particularly, a connecting tube 201 has a first end that is coupled to the discharge end of the pump 124 and a second end that is coupled to the heat sink 123-1. A connecting tube 202 has a first end that is coupled to the heat sink 123-1 and a second end that is coupled to the heat sink 123-2. The suction end of the pump 124 receives the dielectric coolant from within the housing of the electronic device 120 (see arrow 205). The pump 124 pushes the dielectric coolant through the connecting tube 201 toward the heat sink 123-1. The dielectric coolant exiting the heat sink 123-1 goes toward the heat sink 123-2 through the connecting tube 202. The dielectric coolant exiting the heatsink 123-2 (see arrow 206) may be directed toward another heatsink by way of another connecting tube or simply exit to the tank with or without another connecting tube.

Figure 3:
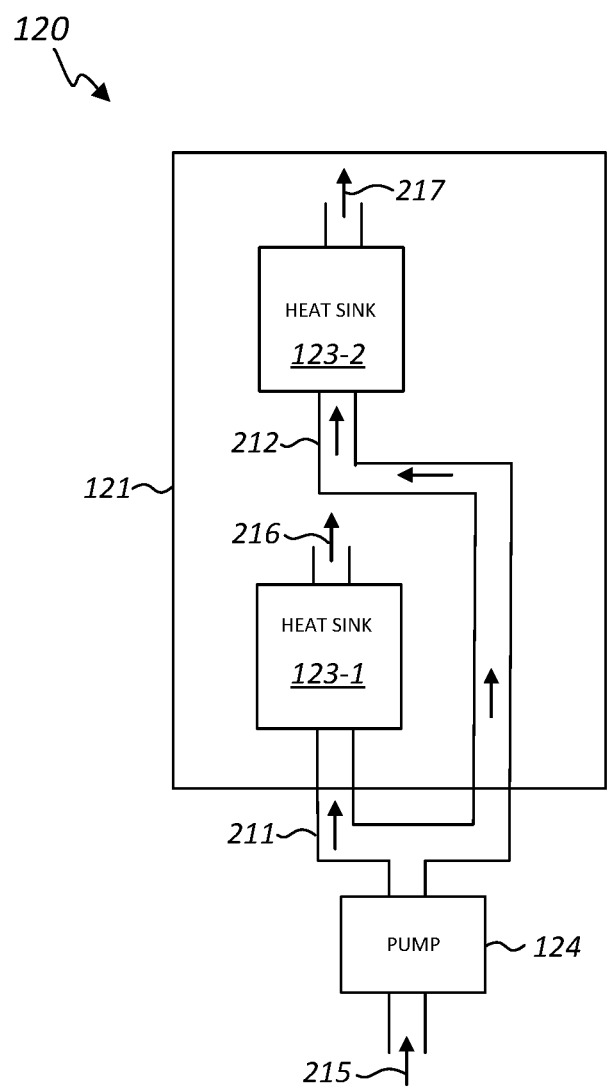
FIG. 3 is a schematic plan view of an electronic device in the immersion cooling system of FIG. 1 in accordance with an embodiment of the present invention.

FIG. 3 is a schematic plan view of an electronic device 120 in the immersion cooling system 100 in accordance with an embodiment of the present invention. In the example of FIG. 3, a plurality of heat sinks 123 are attached on corresponding electronic components that are mounted on the motherboard 121. The pump 124 directs the dielectric coolant to flow toward the heat sinks 123 by way of connecting tubes that are arranged in parallel. More particularly, a connecting tube 211 has a first end that is coupled to a discharge end of the pump 124 and a second end that is coupled to the heat sink 123-1. A connecting tube 211 has a first end that is coupled to the discharge end of the pump 124 and a second end that is coupled to the heat sink 123-2. The suction end of the pump 124 receives the dielectric coolant from within the housing of the electronic device 120 (see arrow 215). The pump 124 pushes the dielectric coolant through the connecting tube 211 toward the heat sink 123-1 and through the connecting tube 212 toward the heat sink 123-2, in parallel. The dielectric coolant exiting the heatsink 123-1 (see arrow 216) and/or the heat sink 123-2 (see arrow 217) may be directed toward another heatsink by way of another connecting tube or simply exit to the tank with or without another connecting tube.

In the immersion cooling system 100, the pump 124 serves as a forced convection device that directs the dielectric coolant toward the heat sinks 123. In other embodiments of the present invention, a fan serves as the forced convection device as now explained beginning with FIG. 4.

Figure 4:
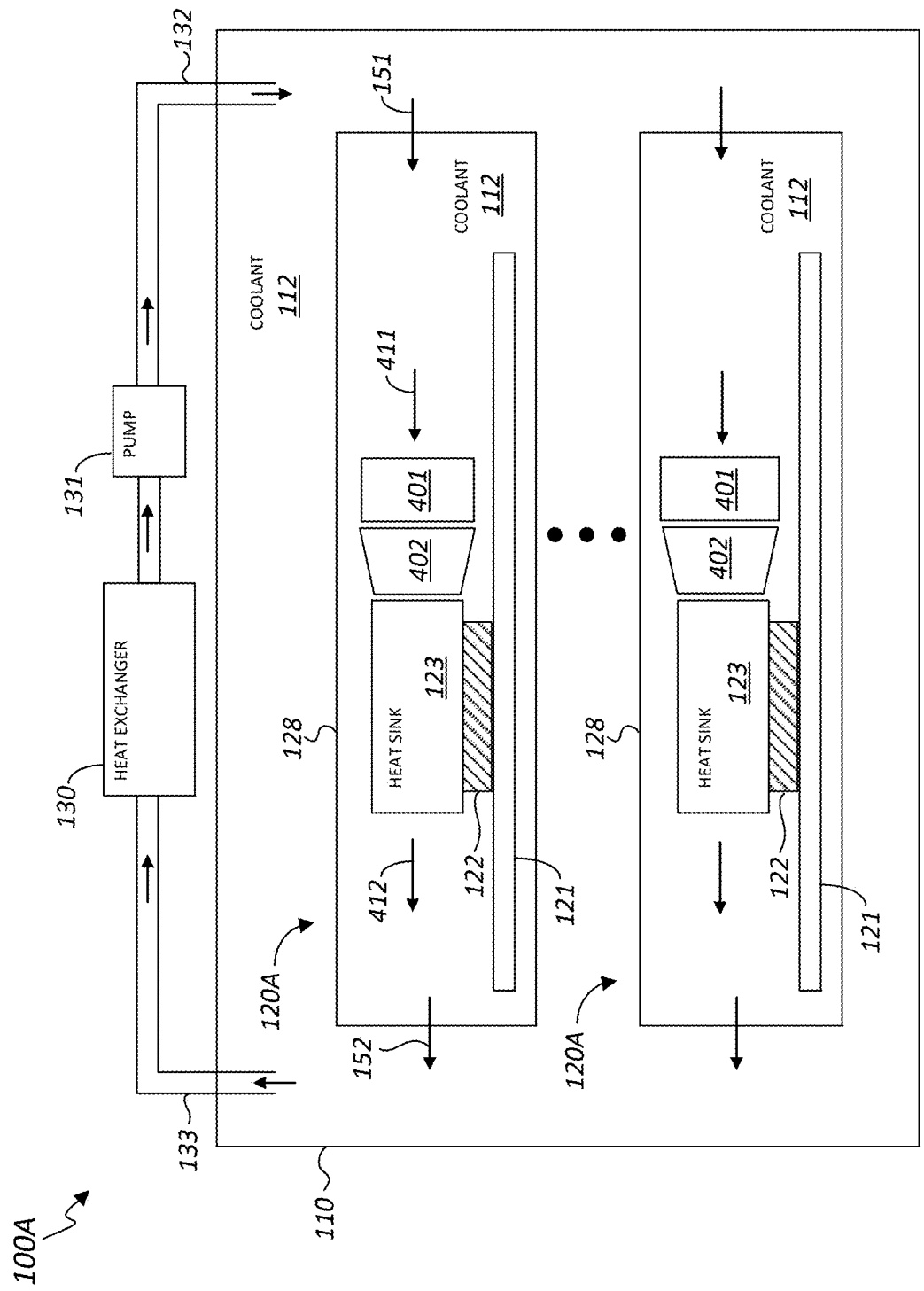
FIG. 4 is a schematic diagram of an immersion cooling system in accordance with an embodiment of the present invention.

FIG. 4 is a schematic diagram of an immersion cooling system 100A in accordance with an embodiment of the present invention. The immersion cooling system 100A is the same as the immersion cooling system 100 of FIG. 1 except for the use of an axial fan, instead of an internal pump, as a forced convection device that directs the dielectric coolant toward the heat sink. That is, in the immersion cooling system 100A, each electronic device, which is labeled as 120A, has an axial fan 401 within the housing 128 instead of an internal oil pump 124. The immersion cooling systems 100 and 100A are otherwise the same.

The heat sink 123 has cooling fins in the example of FIG. 4. The fan 401, which is submerged in the dielectric coolant 112 within the housing 128, moves the dielectric coolant 112 through a fan shroud 402 in the horizontal direction toward the heat sink 123 (see arrow 411). Dielectric coolant directed toward the heat sink 123 by the fan 401 exits at the other side of the heat sink 123 (see arrow 412). The flow rate and other specifications of the fan 401 depend on the particulars of the dielectric coolant 112, the design of the heat sink 123, and the target operating temperature. Other labels of FIG. 4 have been explained in the discussion of FIG. 1.

Figure 5:
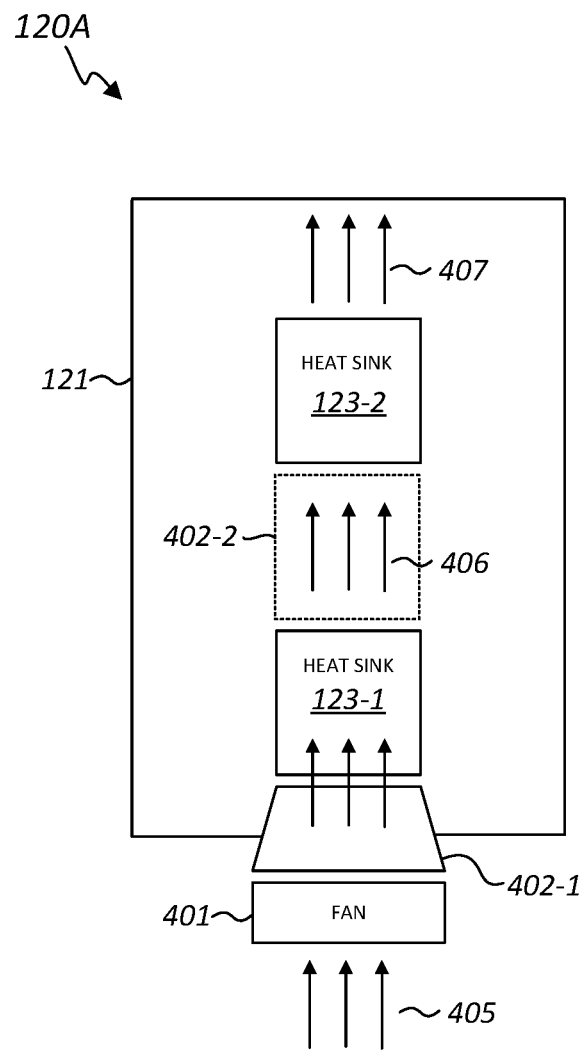
FIG. 5 is a schematic plan view of an electronic device in the immersion cooling system of FIG. 4 in accordance with an embodiment of the present invention.

FIG. 5 is a schematic plan view of an electronic device 120A in the immersion cooling system 100A in accordance with an embodiment of the present invention. In the example of FIG. 5, a plurality of heat sinks 123 are attached on corresponding electronic components that are mounted on the motherboard 121. The fan 401 moves the dielectric coolant from within the housing of the electronic device 120A (see arrows 405) through a fan shroud 402-1 toward the heat sink 123-1. Dielectric coolant that exits the heat sink 123-1 (see arrows 406) is directed toward the heat sink 123-2 through a fan shroud 402-2. Dielectric coolant that exits the heat sink 123-2 (see arrows 407) may be directed toward another heat sink through another fan shroud or simply exit to the tank. It is to be noted that the use of additional fan shrouds, such as the fan shroud 402-2 depends on the particulars of the fan 401. For example, if the fan 401 is strong enough to overcome the flow impedance presented by the dielectric coolant, the fan shroud 402-2 facilitates forcing the dielectric coolant to the heat sink 123-2. However, if the performance of the fan 401 is impacted by the flow impedance presented by the dielectric coolant, the fan shroud 402-2 may be omitted to reduce flow impedance.

Figure 6:
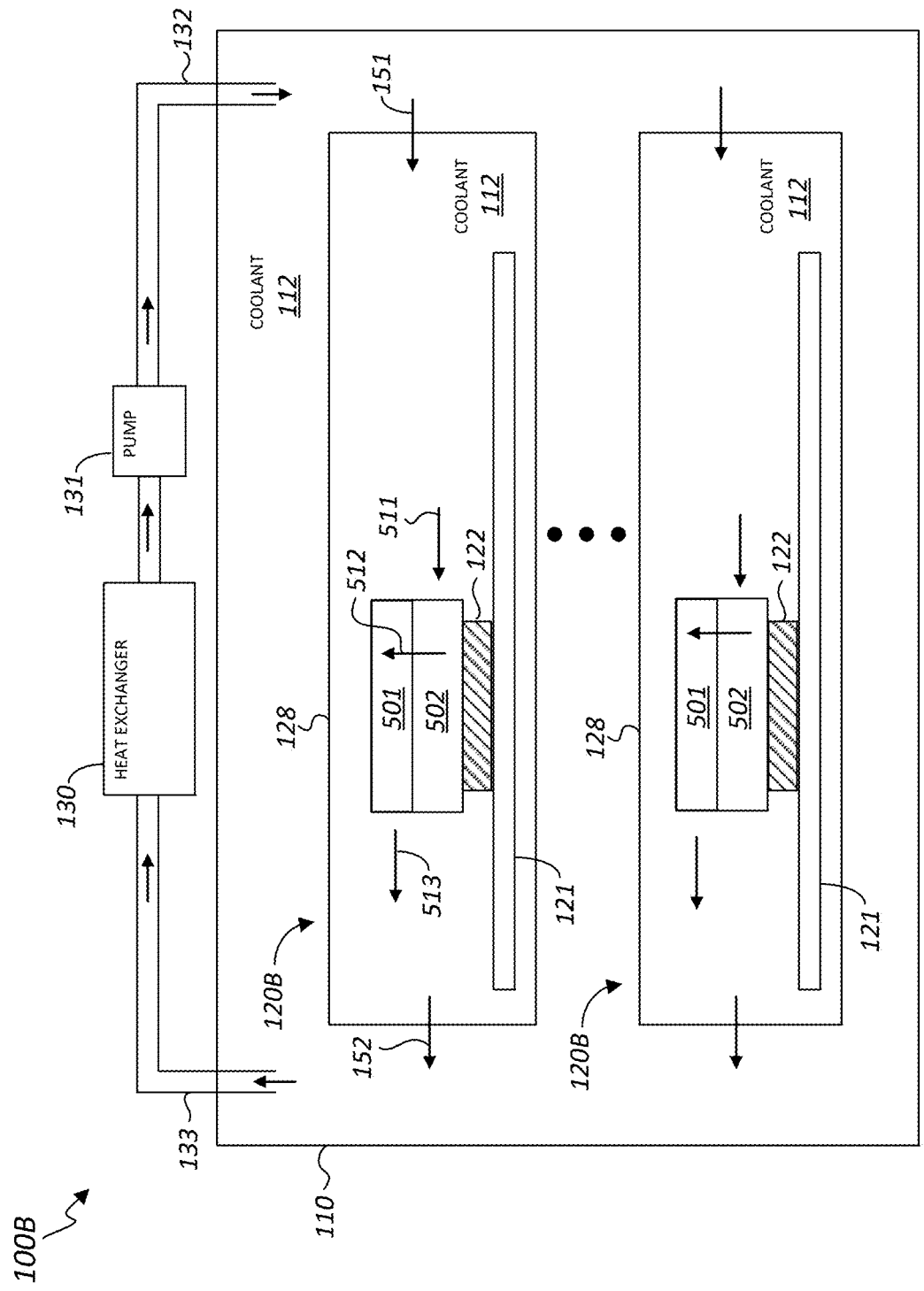
FIG. 6 is a schematic diagram of an immersion cooling system in accordance with an embodiment of the present invention.

FIG. 6 is a schematic diagram of an immersion cooling system 100B in accordance with an embodiment of the present invention. The immersion cooling system 100B is the same as the immersion cooling system 100 of FIG. 1 except for the use of a centrifugal fan, instead of an internal pump, as a forced convection device to direct the dielectric coolant toward the heat sink. That is, in the immersion cooling system 100B, each electronic device, which is labeled as 120B, has a heat sink 502 with an integrated centrifugal fan 501 instead of an internal oil pump 124. The immersion cooling systems 100 and 100B are otherwise the same.

The heat sink 502 has cooling fins in the example of FIG. 6. The fan 501, which may be a blower fan, is disposed on top of the heat sink 502. The fan 501 moves the dielectric coolant 112 vertically along the axis of the fan 501. Accordingly, the dielectric coolant 112 enters the heat sink 502 along an in-plane direction (i.e., in the horizontal direction along a plane of the motherboard 121) (see arrow 511), moves upwards along an axial direction (i.e., perpendicular to the plane of the motherboard 121) (see arrow 512), and exits the fan 501 along the in-plane direction (see arrow 513). Other labels of FIG. 6 have been explained in the discussion of FIG. 1.

Figure 7:
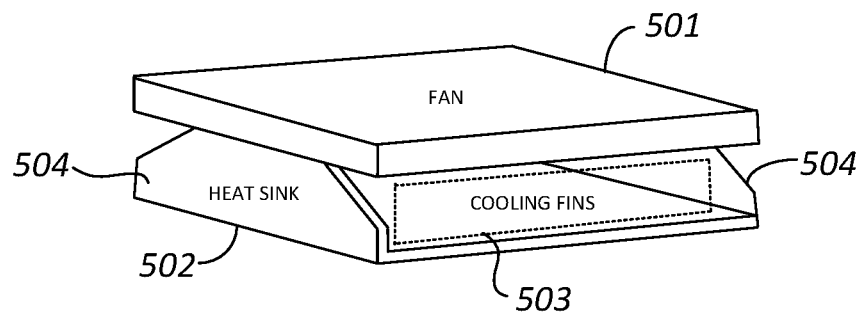
FIG. 7 is a schematic perspective view of a heat sink with an integrated centrifugal fan in the immersion cooling system of FIG. 6, in accordance with an embodiment of the present invention.

FIG. 7 is a schematic perspective view of a heat sink 502 with an integrated centrifugal fan 501 in accordance with an embodiment of the present invention. In the example of FIG. 7, the heat sink 502 has sidewalls 504. Cooling fins, which are generally labeled as 503, are disposed between the sidewalls 504 under the fan 501.

Figure 8:
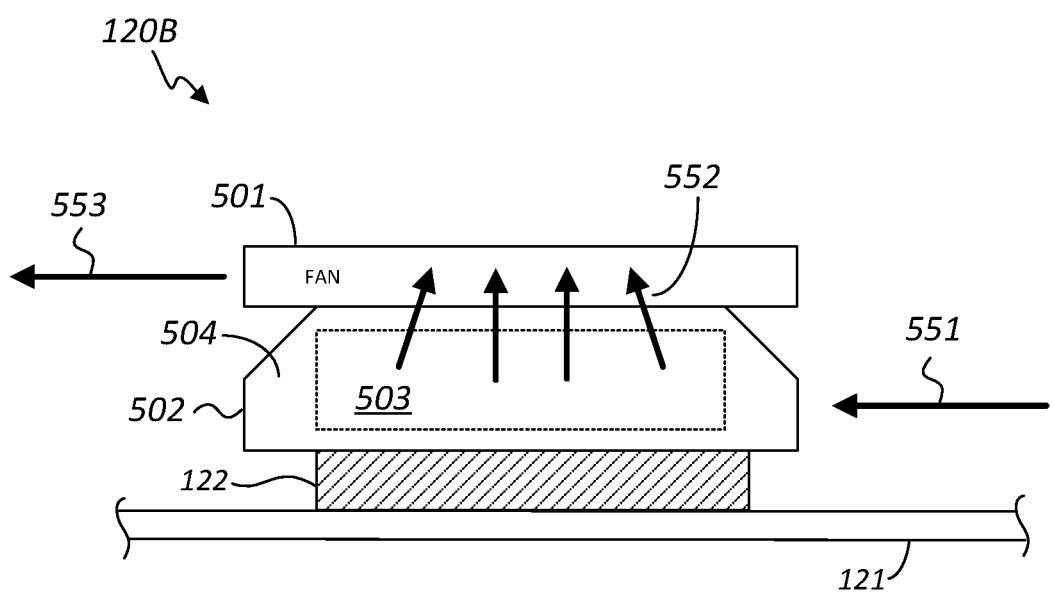
FIG. 8 is a schematic side view of an electronic device in the immersion cooling system of FIG. 6 in accordance with an embodiment of the present invention.

FIG. 8 is a schematic side view of the electronic device 120B in accordance with an embodiment of the present invention. In the example of FIG. 8, the fan 501 is disposed on top of the heat sink 502. The heat sink 502 is attached to a top surface of the electronic component 122, which is mounted on the motherboard 121. During operation, the fan 501 moves the dielectric coolant toward the heat sink 502 along the in-plane direction (see arrow 551) to the surface of the cooling fins 503, and along the axial direction toward the fan 501 (see arrows 552). The dielectric coolant directed through the heat sink 502 exits the fan 501 along the in-plane direction (see arrow 553).

While specific embodiments of the present invention have been provided, it is to be understood that these embodiments are for illustration purposes and not limiting. Many additional embodiments will be apparent to persons of ordinary skill in the art reading this disclosure.

What is claimed is:

1. An immersion cooling system comprising:
   a tank that contains a dielectric coolant;
   a first pump that is disposed outside the tank, the first pump having a suction end that is coupled to an outlet of the tank and a discharge end that is coupled to an inlet of the tank;
   a heat exchanger that is coupled between the outlet of the tank and the inlet of the tank; and
   a plurality of electronic devices that are submerged in the dielectric coolant in the tank, each of the plurality of electronic devices comprising:
   a motherboard;
   a first electronic component that is mounted on the motherboard;
   a first heat sink that is attached to the first electronic component;
   a first connecting tube having a first end that is coupled to the first heat sink;
   a second pump that is submerged in the dielectric coolant within a housing of the electronic device, the second pump having a suction end that is open to receive the dielectric coolant and a discharge end that is coupled to a second end of the first connecting tube.

2. The immersion cooling system of claim 1, wherein each of the plurality of electronic devices comprises a server computer.

3. The immersion cooling system of claim 1, wherein the first electronic component is a central processing unit (CPU) or a graphics processing unit (GPU).

4. The immersion cooling system of claim 1, wherein the first heat sink has a plurality of cooling fins.

5. The immersion cooling system of claim 1, wherein the first heat sink is a cold plate.

6. An immersion cooling system comprising:
   a tank containing a dielectric coolant;
   a main pump that is external to the tank, the main pump having a discharge end that is coupled to an inlet of the tank and a suction end that is coupled to an outlet of the tank; and
   an electronic device that is submerged in the dielectric coolant in the tank, the electronic device comprising:
   a motherboard;
   an electronic component;
   a heat sink that is attached to the electronic component; and
   a forced convection device that is submerged in the dielectric coolant within a housing of the electronic device, wherein the forced convection device directs the dielectric coolant toward the heat sink, wherein the forced convection device is an axial fan that directs the dielectric coolant toward the heat sink.

7. The immersion cooling system of claim 6, wherein the electronic component is a central processing unit (CPU) or a graphics processing unit (GPU).

8. An immersion cooling system comprising:
   a tank containing a dielectric coolant;
   a main pump that is external to the tank, the main pump having a discharge end that is coupled to an inlet of the tank and a suction end that is coupled to an outlet of the tank;
   a heat exchanger that is coupled between the outlet of the tank and the inlet of the tank; and
   an electronic device that is submerged in the dielectric coolant in the tank, the electronic device comprising:
   a substrate;
   an electronic component that is mounted on the substrate;
   a heatsink that is attached to the electronic component; and
   an internal pump that is submerged in the dielectric coolant, the internal pump having a suction end that is open to receive the dielectric coolant and a discharge end that directs the dielectric coolant toward the heat sink.

9. The immersion cooling system of claim 8, further comprising a connecting tube, the connecting tube having a first end that is coupled to the discharge end of the internal pump and a second end that is coupled to the heatsink.

10. The immersion cooling system of claim 8, wherein the heat sink has a plurality of cooling fins.

11. The immersion cooling system of claim 8, wherein the heat sink is a cold plate.

12. The immersion cooling system of claim 8, wherein the electronic component is a central processing unit (CPU) or a graphics processing unit (GPU).

13. An immersion cooling system comprising:
    a tank that contains a dielectric coolant;
    a first pump that is disposed outside the tank, the first pump having a suction end that is coupled to an outlet of the tank and a discharge end that is coupled to an inlet of the tank; and
    a plurality of electronic devices that are submerged in the dielectric coolant in the tank, each of the plurality of electronic devices comprising:
    a motherboard;
    a first electronic component that is mounted on the motherboard;
    a first heat sink that is attached to the first electronic component;
    a first connecting tube having a first end that is coupled to the first heat sink; and
    a second pump that is submerged in the dielectric coolant within a housing of the electronic device, the second pump having a suction end that is open to receive the dielectric coolant and a discharge end that is coupled to a second end of the first connecting tube,
    wherein each of the plurality of electronic devices further comprises:
    a second electronic component that is mounted on the motherboard;
    a second heat sink that is attached to the second electronic component; and
    a second connecting tube having a first end that is coupled to the first heat sink and a second end that is coupled to the second heat sink.

14. The immersion cooling system of claim 13, wherein each of the plurality of electronic devices comprises a server computer.

15. The immersion cooling system of claim 13, wherein the first electronic component is a central processing unit (CPU) or a graphics processing unit (GPU).

16. The immersion cooling system of claim 13, wherein the first heat sink has a plurality of cooling fins.

17. The immersion cooling system of claim 13, wherein the first heat sink is a cold plate.

18. An immersion cooling system comprising:

a tank that contains a dielectric coolant;
a first pump that is disposed outside the tank, the first pump having a suction end that is coupled to an outlet of the tank and a discharge end that is coupled to an inlet of the tank; and
a plurality of electronic devices that are submerged in the dielectric coolant in the tank, each of the plurality of electronic devices comprising:
a motherboard;
a first electronic component that is mounted on the motherboard;
a first heat sink that is attached to the first electronic component;
a first connecting tube having a first end that is coupled to the first heat sink; and
a second pump that is submerged in the dielectric coolant within a housing of the electronic device, the second pump having a suction end that is open to receive the dielectric coolant and a discharge end that is coupled to a second end of the first connecting tube,
wherein each of the plurality of electronic devices further comprises:
a second electronic component that is mounted on the motherboard;
a second heat sink that is attached to the second electronic component; and
a second connecting tube having a first end that is coupled to the second heat sink and a second end that is coupled to the discharge end of the second pump, the first and
second connecting tubes being coupled to the second pump in parallel.

19. The immersion cooling system of claim 18, wherein each of the plurality of electronic devices comprises a server computer.

20. The immersion cooling system of claim 18, wherein the first electronic component is a central processing unit (CPU) or a graphics processing unit (GPU).

21. The immersion cooling system of claim 18, wherein the first heat sink has a plurality of cooling fins.

22. The immersion cooling system of claim 18, wherein the first heat sink is a cold plate.

23. An immersion cooling system comprising:
a tank containing a dielectric coolant;
a main pump that is external to the tank, the main pump having a discharge end that is coupled to an inlet of the tank and a suction end that is coupled to an outlet of the tank; and
an electronic device that is submerged in the dielectric coolant in the tank, the electronic device comprising:
a motherboard;
an electronic component;
a heat sink that is attached to the electronic component; and
a forced convection device that is submerged in the dielectric coolant within a housing of the electronic device, wherein the forced convection device directs the dielectric coolant toward the heat sink,
wherein the forced convection device is a centrifugal fan that is attached to a top portion of the heatsink.

24. The immersion cooling system of claim 23, wherein the electronic component is a central processing unit (CPU) or a graphics processing unit (GPU).

\* \* \* \* \*